(12) United States Patent
Jo

(10) Patent No.: US 8,946,046 B1
(45) Date of Patent: Feb. 3, 2015

(54) GUIDED PATH FOR FORMING A CONDUCTIVE FILAMENT IN RRAM

(75) Inventor: Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 13/462,653

(22) Filed: May 2, 2012

(51) Int. Cl.
*H01L 21/20* (2006.01)
*H01L 21/4763* (2006.01)
*H01L 45/00* (2006.01)

(52) U.S. Cl.
CPC ............ *H01L 21/4763* (2013.01); *H01L 45/04* (2013.01)
USPC ........... 438/396; 438/239; 438/386; 438/393; 257/2; 257/3; 257/4; 257/5

(58) Field of Classification Search
CPC ............................. H01L 45/04; H01L 21/4763
USPC .................... 438/239, 386, 393, 396; 257/2–5
See application file for complete search history.

(56) References Cited

U.S. PATENT DOCUMENTS

| | | | |
|---|---|---|---|
| 680,652 | A | 8/1901 | Elden |
| 4,433,468 | A | 2/1984 | Kawamata |
| 4,684,972 | A | 8/1987 | Owen et al. |
| 4,741,601 | A | 5/1988 | Saito |
| 5,139,911 | A | 8/1992 | Yagi et al. |
| 5,242,855 | A | 9/1993 | Oguro |
| 5,278,085 | A | 1/1994 | Maddox, III et al. |
| 5,315,131 | A | 5/1994 | Kishimoto et al. |
| 5,335,219 | A | 8/1994 | Ovshinsky et al. |
| 5,360,981 | A | 11/1994 | Owen et al. |
| 5,457,649 | A | 10/1995 | Eichman et al. |
| 5,538,564 | A | 7/1996 | Kaschmitter |
| 5,541,869 | A | 7/1996 | Rose et al. |
| 5,594,363 | A | 1/1997 | Freeman et al. |
| 5,614,756 | A | 3/1997 | Forouhi et al. |
| 5,645,628 | A | 7/1997 | Endo et al. |

(Continued)

FOREIGN PATENT DOCUMENTS

| | | |
|---|---|---|
| EP | 2405441 A1 | 1/2012 |
| EP | 2408035 A2 | 1/2012 |

(Continued)

OTHER PUBLICATIONS

Notice of Allowance for U.S. Appl. No. 12/814,410 dated Jan. 8, 2013.

(Continued)

*Primary Examiner* — Bac Au
(74) *Attorney, Agent, or Firm* — Ogawa P.C.

(57) ABSTRACT

A method of forming a non-volatile memory device, includes forming a first electrode above a substrate, forming a dielectric layer overlying the first electrode, forming an opening structure in a portion of the dielectric layer to expose a surface of the first electrode having an aspect ratio, forming a resistive switching material overlying the dielectric layer and filling at least a portion of the opening structure using a deposition process, the resistive switching material having a surface region characterized by a planar region and an indent structure, the indent structure overlying the first electrode, maintaining a first thickness of resistive switching material between the planar region and the first electrode, maintaining a second thickness of resistive switching material between the indent structure and the first electrode, wherein the first thickness is larger than the second thickness, and forming a second electrode overlying the resistive switching material including the indent structure.

20 Claims, 11 Drawing Sheets

(56) References Cited

U.S. PATENT DOCUMENTS

| | | |
|---|---|---|
| 5,714,416 A | 2/1998 | Eichman et al. |
| 5,751,012 A | 5/1998 | Wolstenholme et al. |
| 5,840,608 A | 11/1998 | Chang |
| 5,970,332 A | 10/1999 | Pruijmboom et al. |
| 5,973,335 A | 10/1999 | Shannon |
| 5,998,244 A | 12/1999 | Wolstenholme et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,627,530 B2 | 9/2003 | Li et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,881,994 B2 | 4/2005 | Lee et al. |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,102,150 B2 | 9/2006 | Harshfield et al. |
| 7,122,853 B1 | 10/2006 | Gaun et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,254,053 B2 | 8/2007 | Krieger et al. |
| 7,289,353 B2 | 10/2007 | Spitzer et al. |
| 7,324,363 B2 | 1/2008 | Kerns et al. |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,749,805 B2 | 7/2010 | Pinnow et al. |
| 7,772,581 B2 | 8/2010 | Lung |
| 7,778,063 B2 | 8/2010 | Brubaker et al. |
| 7,786,464 B2 | 8/2010 | Nirschl et al. |
| 7,786,589 B2 | 8/2010 | Matsunaga et al. |
| 7,824,956 B2 | 11/2010 | Schricker et al. |
| 7,829,875 B2 | 11/2010 | Scheuerlein |
| 7,835,170 B2 | 11/2010 | Bertin et al. |
| 7,859,884 B2 | 12/2010 | Scheuerlein |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,968,419 B2 | 6/2011 | Li et al. |
| 7,972,897 B2 | 7/2011 | Kumar et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,258,020 B2 | 9/2012 | Herner |
| 8,265,136 B2 | 9/2012 | Hong et al. |
| 8,274,812 B2 | 9/2012 | Jo et al. |
| 8,315,079 B2 | 11/2012 | Kuo et al. |
| 8,320,160 B2 | 11/2012 | Nazarian |
| 8,374,018 B2 | 2/2013 | Lu |
| 8,385,100 B2 | 2/2013 | Kau et al. |
| 8,394,670 B2 | 3/2013 | Herner |
| 8,467,227 B1 | 6/2013 | Jo |
| 8,658,476 B1 | 2/2014 | Sun et al. |
| 8,659,003 B2 | 2/2014 | Herner et al. |
| 2003/0141565 A1 | 7/2003 | Hirose et al. |
| 2003/0174574 A1 | 9/2003 | Perner et al. |
| 2003/0206659 A1 | 11/2003 | Hamanaka |
| 2004/0026682 A1 | 2/2004 | Jiang |
| 2004/0170040 A1 | 9/2004 | Rinerson et al. |
| 2004/0202041 A1 | 10/2004 | Hidenori |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu |
| 2006/0134837 A1 | 6/2006 | Subramanian et al. |
| 2006/0246606 A1 | 11/2006 | Hsu et al. |
| 2006/0281244 A1 | 12/2006 | Ichige et al. |
| 2007/0008773 A1 | 1/2007 | Scheuerlein |
| 2007/0015348 A1 | 1/2007 | Hsu et al. |
| 2007/0045615 A1 | 3/2007 | Cho et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0048164 A1 | 2/2008 | Odagawa |
| 2008/0089110 A1 | 4/2008 | Robinett et al. |
| 2008/0090337 A1 | 4/2008 | Williams |
| 2008/0106925 A1 | 5/2008 | Paz de Araujo et al. |
| 2008/0106926 A1 | 5/2008 | Brubaker et al. |
| 2008/0185567 A1 | 8/2008 | Kumar et al. |

(56) References Cited

U.S. PATENT DOCUMENTS

| | | | |
|---|---|---|---|
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278990 A1 | 11/2008 | Kumar et al. |
| 2008/0304312 A1 | 12/2008 | Ho et al. |
| 2008/0311722 A1 | 12/2008 | Petti et al. |
| 2009/0001345 A1 | 1/2009 | Schricker et al. |
| 2009/0003717 A1 | 1/2009 | Sekiguchi et al. |
| 2009/0014707 A1 | 1/2009 | Lu et al. |
| 2009/0052226 A1 | 2/2009 | Lee et al. |
| 2009/0095951 A1 | 4/2009 | Kostylev et al. |
| 2009/0152737 A1* | 6/2009 | Harshfield | 257/774 |
| 2009/0168486 A1 | 7/2009 | Kumar |
| 2009/0231910 A1 | 9/2009 | Liu et al. |
| 2009/0250787 A1 | 10/2009 | Kutsunai |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0298224 A1 | 12/2009 | Lowrey |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0044708 A1 | 2/2010 | Lin et al. |
| 2010/0046622 A1 | 2/2010 | Doser et al. |
| 2010/0084625 A1 | 4/2010 | Wicker et al. |
| 2010/0085798 A1 | 4/2010 | Lu et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0157651 A1 | 6/2010 | Kumar et al. |
| 2010/0157710 A1 | 6/2010 | Lambertson et al. |
| 2010/0163828 A1 | 7/2010 | Tu |
| 2010/0176368 A1 | 7/2010 | Ko et al. |
| 2010/0219510 A1 | 9/2010 | Scheuerlein et al. |
| 2010/0221868 A1* | 9/2010 | Sandoval | 438/102 |
| 2010/0321095 A1 | 12/2010 | Mikawa et al. |
| 2011/0006275 A1 | 1/2011 | Roelofs et al. |
| 2011/0089391 A1 | 4/2011 | Mihnea et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0155991 A1 | 6/2011 | Chen |
| 2011/0194329 A1 | 8/2011 | Ohba et al. |
| 2011/0198557 A1 | 8/2011 | Rajendran et al. |
| 2011/0204312 A1* | 8/2011 | Phatak | 257/4 |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0312151 A1 | 12/2011 | Herner |
| 2011/0317470 A1 | 12/2011 | Lu et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0076203 A1 | 3/2012 | Sugimoto et al. |
| 2012/0080798 A1* | 4/2012 | Harshfield | 257/770 |
| 2012/0104351 A1 | 5/2012 | Wei et al. |
| 2012/0108030 A1 | 5/2012 | Herner |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0155146 A1 | 6/2012 | Ueda et al. |
| 2012/0205606 A1* | 8/2012 | Lee et al. | 257/2 |
| 2012/0220100 A1 | 8/2012 | Herner |
| 2012/0235112 A1 | 9/2012 | Huo et al. |
| 2012/0236625 A1 | 9/2012 | Ohba et al. |
| 2012/0269275 A1 | 10/2012 | Hannuksela |
| 2012/0305874 A1 | 12/2012 | Herner |
| 2012/0326265 A1 | 12/2012 | Lai et al. |
| 2013/0026440 A1 | 1/2013 | Yang et al. |
| 2014/0070160 A1 | 3/2014 | Ishikawa et al. |

FOREIGN PATENT DOCUMENTS

| | | | |
|---|---|---|---|
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| KR | 1020110014248 A | 2/2011 |
| WO | WO 03/034498 A1 | 4/2003 |
| WO | WO 2009/005699 A1 | 1/2009 |
| WO | WO 2011/133138 A1 | 10/2011 |

OTHER PUBLICATIONS

Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 13/174,264 dated Mar. 6, 2013.
Office Action for U.S. Appl. No. 13/679,976, dated Mar. 6, 2013.
Notice of Allowance for U.S. Appl. No. 12/894,098, dated Mar. 15, 2013.
Office Action for U.S. Appl. No. 13/465,188, dated Mar. 19, 2013.
Office Action for U.S. Appl. No. 12/861,432 dated Mar. 29, 2013.
Notice of Allowance for U.S. Appl. No. 13/748,490, dated Apr. 9, 2013.
Office Action for U.S. Appl. No. 13/725,331, dated May 20, 2013.
International Search Report and Written Opinion for PCT/US2012/045312 filed on Jul. 2, 2012.
Office Action for U.S. Appl. No. 13/466,008, dated Jul. 29, 2013.
Russo, U. et al, "Self-Accelerated Thermal Dissolution Model for Reset Programming in Unipolar Resistive-Switching Memory (RRAM) Devices", IEEE Transactions on Electron Devices, Feb. 2009, pp. 193-200, vol. 56, Issue 2.
Cagli, C. et al, "Evidence for threshold switching in the set process of NiO-based RRAM and physical modeling for set, reset, retention and distrub prediction", 2008 IEEE International Electron Devices Meeting (IEDM), Dec. 15-17, 2008, pp. 1-4, San Francisco, CA, USA.
Office Action for U.S. Appl. No. 13/077,941, dated Aug. 12, 2013.
Office Action of U.S. Appl. No. 13/436,714 dated Dec. 7, 2012.
Jian Hu et al., "Area-Dependent Switching in Thin Film-Silicon Devices", Materials Research Society, Mal. Res. Soc. Symp Proc., 2003, pp. A18.3.1-A18.3.6, vol. 762.
André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Muller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60, 1983, pp. 1273-1280, North Holland Publishing Company/Physical Society of Japan.

(56) References Cited

OTHER PUBLICATIONS

J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids, 1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.
Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-05242007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", 9th Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.
Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of Cr/p$^+$a-Si:H/V Analog Switching Devices", IEEE Transactions on Electron Devices, Sep. 2000, pp. 1751-1757, vol. 47 No. 9, IEEE.

(56) References Cited

OTHER PUBLICATIONS

A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñ,ăcũ ē et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.
Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.
International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti-W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action for U.S. Appl. No. 13/436,714, dated Aug. 27, 2013.
Notice of Allowance for U.S. Appl. No. 13/679,976, dated Sep. 17, 2013.
Office Action for U.S. Appl. No. 13/189,401, dated Sep. 30, 2013.
Office Action for U.S. Appl. No. 13/462,653, dated Sep. 30, 2013.
Corrected Notice of Allowance for U.S. Appl. No. 13/733,828, dated Oct. 1, 2013.
Notice of Allowance for U.S. Appl. No. 13/733,828, dated Aug. 8, 2013.
Office Action for U.S. Appl. No. 13/594,665, dated Aug. 2, 2013.
Notice of Allowance for U.S. Appl. No. 13/769,152, dated Oct. 8, 2013.
Notice of Allowance for U.S. Appl. No. 13/905,074, dated Oct. 8, 2013.
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 13/920,021, dated Jan. 10, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 13/705,082, dated Sep. 2, 2014.
Office Action for U.S. Appl. No. 13/739,283, dated Sep. 11, 2014.
Office Action for U.S. Appl. No. 13/756,498, dated Sep. 12, 2014.

(56) References Cited

OTHER PUBLICATIONS

Notice of Allowance for U.S. Appl. No. 13/462,653 dated Sep. 17, 2014.
Notice of Allowance for U.S. Appl. No. 13/586,815, dated Sep. 18, 2014.
Notice of Allowance for U.S. Appl. No. 13/920,021, dated Sep. 18, 2014.
Office Action for U.S. Appl. No. 13/189,401, dated Sep. 22, 2013.
Notice of Allowance for U.S. Appl. No. 13/594,665 dated Sep. 26, 2014.
Notice of Allowance for U.S. Appl. No. 13/077,941, dated Oct. 8, 2014.
Notice of Allowance for U.S. Appl. No. 13/077,941, dated Aug. 27, 2014.

* cited by examiner

GUIDED PATH FOR FORMING A CONDUCTIVE FILAMENT IN RRAM

REFERENCE TO RELATED APPLICATIONS

This application is related to patent application Ser. No. 13/156,232 filed Jun. 8, 2011, which claims priority to Provisional Application No. 61/352,761 filed Jun. 8, 2010, commonly assigned, and incorporated herein by reference for all purpose.

BACKGROUND

The present invention is related to switching devices. More particularly, the present invention provides a device structure and a method to form a resistive switching device having an improved switching performance. Embodiments of the present invention have been applied to a non-volatile memory device. But it should be recognized that the present invention can have a much broader range of applicability.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance, however, such memory cells are difficult to scale to small sizes. In another example of this, for ORAM devices reliability of such memories is often poor. As yet another example of this, switching of PCRAM devices typically includes Joules heating and undesirably require high power consumption.

From the above, improved semiconductor memory devices that can scale to smaller dimensions with reduced drawbacks are therefore desirable.

BRIEF SUMMARY OF THE PRESENT INVENTION

The present invention is related to switching devices. More particularly, the present invention provides a device structure and a method to form a resistive switching device having an improved switching performance. Embodiments of the present invention have been applied to a non-volatile memory device. But it should be recognized that the present invention can have a much broader range of applicability.

According to one aspect of the invention, a method of forming a resistive switching device for a non-volatile memory device is disclosed. One technique includes providing a substrate having a surface region, forming a first dielectric material overlying the surface region of the substrate, and forming a first electrode structure in a portion of the first dielectric material. A process includes forming a second dielectric material overlying the first electrode, forming an opening structure in a portion of the second dielectric material to expose a surface region of the first electrode structure, the opening structure being characterized by an aspect ratio, and forming a resistive switching material overlying the second dielectric material and filling at least a portion of the opening structure using a deposition process, the resistive switching material having a surface region characterized by a planar region and an indent structure, the indent structure overlying the first electrode structure. A method includes maintaining a first thickness of resistive switching material between the planar region and the first electrode structure, maintaining a second thickness of resistive switching material between the indent structure and the first electrode structure, wherein the first thickness is larger than the second thickness, and forming a second electrode structure overlying the resistive switching material including the indent structure.

According to another aspect of the invention, a resistive switching device for a non-volatile memory device is disclosed. A device may include a first electrode, and a resistive switching material configured in an opening region in a dielectric material overlying the first electrode, the resistive switching material being characterized by a surface region having a planar region and an indent structure, at least a portion of the planar region being configured overlying the first electrode while maintaining a first thickness of resistive switching material relative to the first electrode, the indent structure being configured overlying the first electrode while maintaining a second thickness of resistive switching material relative to the first electrode, wherein the first thickness exceeds the second thickness. An apparatus may include a second electrode overlying the resistive switching material including the indent structure.

According to yet another aspect of the invention, a resistive switching device is formed according to a method. One technique includes providing a substrate having a surface region, forming a first dielectric material overlying the surface region of the substrate, and forming a first electrode in a portion of the first dielectric material. A process includes forming a second dielectric material overlying the first electrode, forming an opening structure in a portion of the second dielectric material to expose a surface region of the first electrode structure, the opening structure being characterized by an aspect ratio, and forming a resistive switching material overlying the second dielectric material and filling at least a portion of the opening structure using a deposition process, the resistive switching material having a surface region characterized by a planar region and an indent structure, the indent structure overlying the first electrode structure. A method may include maintaining a first thickness of resistive switching material between the planar region and the first electrode structure, maintaining a second thickness of resistive switching material between the indent structure and the first electrode structure, wherein the first thickness is larger than the second thickness, and forming a second electrode structure overlying the resistive switching material including the indent structure.

In a specific embodiment, a method of forming a resistive switching device for a non-volatile memory device is provided. The method includes providing a substrate having a surface region and forming a first dielectric material overlying the surface region of the substrate. The method includes forming a first electrode structure overlying the first dielectric material and forming a resistive switching material structure overlying the first electrode. The resistive switching material structure includes a vertical side wall region. In various embodiment, the method forms a second dielectric material overlying the resistive switching material structure including the side wall region and forms a first material derived from the resistive switching material and the second dielectric material in a first material region in a vicinity of the side wall region. A second electrode structure is formed overlying the resistive switching material structure including the first material region.

In a specific embodiment, a resistive switching device for a non-volatile memory device is provided. The device includes a first electrode structure, a resistive switching material structure overlying the first electrode. The resistive switching material structure includes a resistive switching material having a vertical side wall region. A dielectric material overlies the resistive switching material structure including the vertical side wall region. The device includes a first material region comprising a first material configured in a vicinity of the vertical side wall region. In various embodiments, the first material is formed and derived from the dielectric material and the resistive switching material. A second electrode is configured overlying the resistive switching material structure and the first material region. In various embodiments, the first material region provides a path and facilitates formation of a conductive structure derived from the second electrode upon application of a programming voltage.

Many benefits can be achieved by ways of the present invention over conventional techniques. For example, embodiments according to the present invention provide various methods and device structures to form a conductive filament structure in a resistive switching device to change a resistance state or bit value of the device. The device is characterized by a low operating voltage (for example, low programming voltage) and a well defined region to form the conductive filament structure for a robust fabrication method. Additionally, various devices according to the present invention can be characterized by a good endurance, reliable and fast switching among others. Additionally, the present device can have programmed to more than one resistive state for a multibit device. The present device disposed in a crossbar configuration can be vertically integrated to form a high density memory device thus drastically reduce cost per bit, a major attribute for present and future application in consumer devices. The present device can be implemented in a vast variety of applications such as date storage, code storage, embedded devices, for example, as configuration bit for field programmable gate array, radiation hardened application, and others. The present device can be configured to be write once read many times, write many times read once, or fully re-writable. Depending on the application, one or more of these benefits can be achieved.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

The present invention is related to switching devices. More particularly, the present invention provides a device structure and a method to form a resistive switching device having an improved switching performance. Embodiments of the present invention have been applied to a non-volatile memory device. But it should be recognized that the present invention can have a much broader range of applicability.

The growth of consumer devices has led to an ever increasing demand for high density memory storage at a low cost per bit. Data storage of current non-volatile memory devices are based on charges stored in a floating gate or a dielectric layer. Scaling of these devices is limited as these devices usually require a transistor device coupled to a memory cell. Further down scale of transistors may not be possible due to short channel effects and others. Additionally, as these devices are three terminal devices, vertical or three dimensional integration of memory cells are difficult to achieve. Switching devices for memory cells arranged in a crossbar configuration can provide a method and a structure for high density integration at a much reduced cost.

Resistive switching device is a two terminal device having a resistive switching material configured in an intersection region of a first electrode and a second electrode. For resistive switching devices using amorphous silicon material as a switching material, the switching mechanism or state change mechanism can be based on a filament structure derived from a conductive material formed in the amorphous silicon material upon application of an electric field. The conductive material can be derived from, for example, the second electrode. The formation of the conductive structure and its interaction with the amorphous silicon material as well as its interaction with the first electrode would affect the switching characteristic thus the performance of the device. As the filament structure is formed in grain boundaries of the amorphous silicon material, switching voltage is usually quite low (no greater than about 6 or 7 volts). However, grain structures in amorphous silicon material are random; the filament structure might have variations from device to device affecting device yield and performance. Embodiments according to the present provide a method and a device structure for a well defined path or preferred path for the formation of the filament structure.

Figure 1:
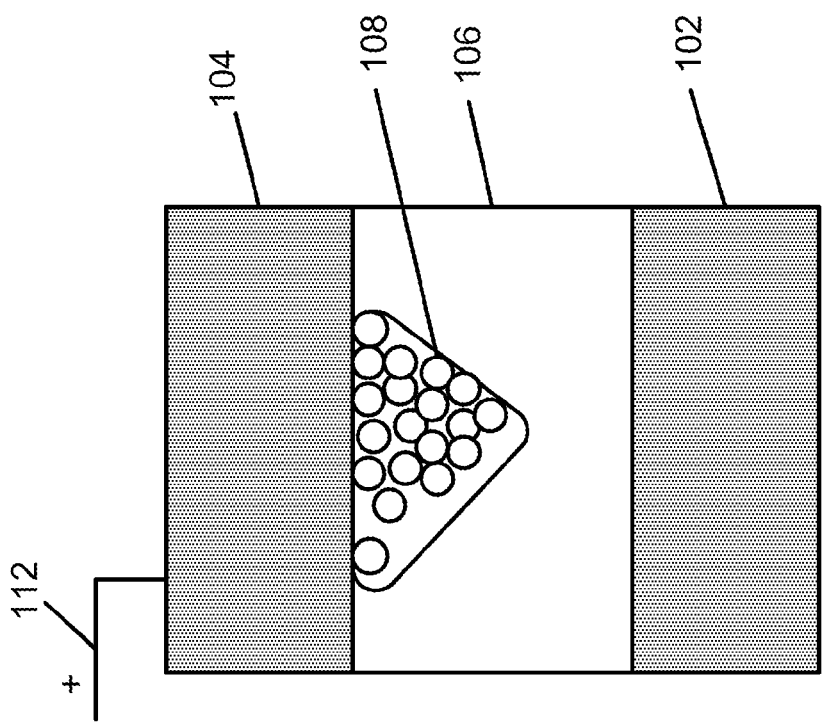

FIG. 1 is a simplified diagram illustrating a conventional switching device structure 100. As shown, the convention switching device includes a first electrode 102, a second electrode 104, and a switching material 106 sandwiched between first electrode 102 and second electrode 104. Second electrode 104 can have a portion that includes a metal material. For switching material 106 using an amorphous silicon material, the metal material can be silver, platinum, palladium, or other suitable metal materials having a suitable diffusivity characteristic in the amorphous silicon material. As shown, upon application of a first voltage 112, a metal region 108 is formed in switching material 106 and in contact with the top electrode. The metal region is formed largely by a diffusion mechanism, assisted by an electric field resulting from the first voltage 112.

Figure 2:
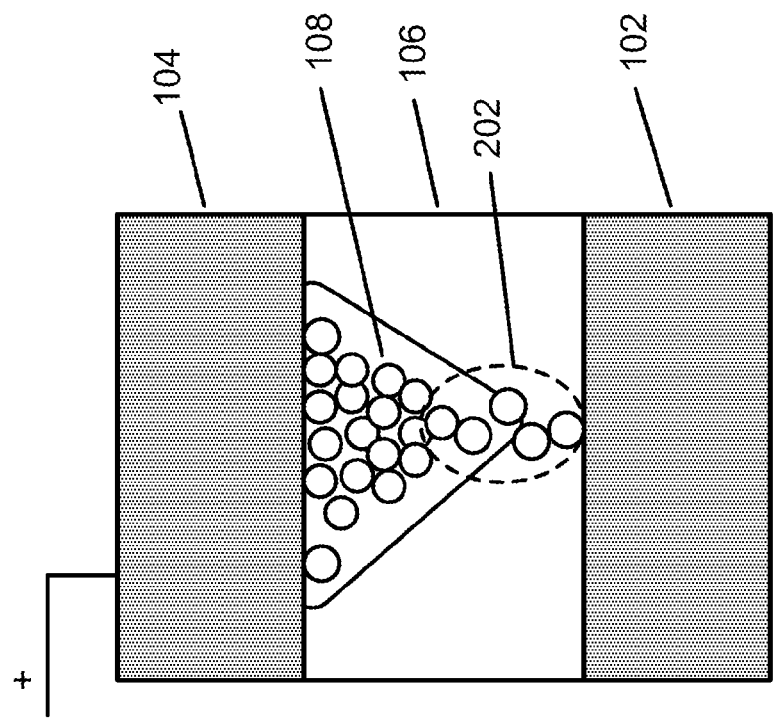
FIGS. 1 and 2 are simplified diagram illustrating a conventional resistive switching device and its operation.

FIG. 2 illustrates growth of metal region 108 in switching material 106 for the conventional resistive switching device. The diffusion of the metal material from second electrode 104 into the switching material is assisted by first voltage 112 and sometimes results in a continuous metal region. As metal region 108 grows, an end region of metal region 108 becomes sharper and closer to the bottom electrode. Once the end region is sharp enough and close enough to the bottom electrode, the electric field would have a much greater effect on the metal region growth than diffusion. As in FIG. 2, a filament structure 202 is formed by hopping of a metal particle from a defect site to the next defect site in the amorphous silicon material upon application of a suitable voltage. Therefore formation of filament structure 202 is due to the presence of the electric filed and aided by diffusion in contrast to the metal region growth. Metal region 108 including filament structure 202 form a conductive path for the resistive switching device. As diffusion of material can be uncontrollable, it is desirable that the formation of metal region especially filament structure 202 can be in a predetermined path controlled substantially by applied electric field.

Figure 3:
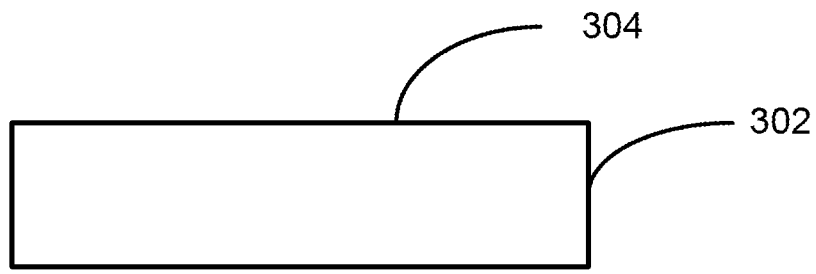
FIGS. 3-13 are simplified diagrams illustrating a method of forming a resistive switching device for a non-volatile memory device according to various embodiments of the present invention.

FIGS. 3-13 illustrate a method for forming a resistive switching device according to various embodiments of the present invention. As shown in FIG. 3, a substrate 302 having a surface region 304 is provided. The substrate can be a semiconductor material such as monocrystalline silicon, silicon on insulator (SOI), silicon germanium, and polycrystalline silicon, and others. Depending on the embodiments, the substrate can further include one or more transistor device formed thereon. The one or more transistor device can be controlling circuitry for the resistive switching device.

In certain embodiments, the semiconductor substrate 302 can have one or more MOS devices formed thereon. The one or more MOS devices can be controlling circuitry for the resistive memory devices in specific embodiments. In other embodiments, the one or more MOS devices may include other functionality, such as a processor, logic, or the like.

In various embodiments, a processor, or the like, may include resistive memory memories as described herein. Because the state-change memories are relatively non-volatile, the states of devices, such as processors, or the like may be maintained while power is not supplied to the processors. To a user, such capability would greatly enhance the power-on power-off performance of devices including such processors. Additionally, such capability would greatly reduce the power consumption of devices including such processors. In particular, because such memories are non-volatile, the processor need not draw power to refresh the memory states, as is common with CMOS type memories. Accordingly, embodiments of the present invention are directed towards processors or other logic incorporating these memory devices, as described herein, devices (e.g. smart phones, network devices) incorporating such memory devices, and the like.

Figure 4:
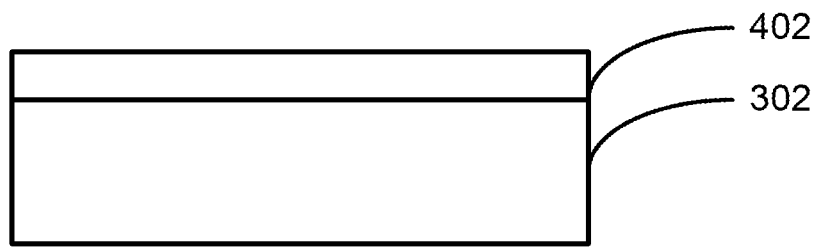

Referring to FIG. 4, the method includes forming a first dielectric material 402 overlying surface region 304 of substrate 302. First dielectric material 402 can be silicon oxide, silicon nitride, silicon oxynitride, a high K dielectric, a low K dielectric, or a dielectric stack having alternating layer of silicon oxide and silicon nitride (for example an ONO stack), including any combination of these, and others. First dielectric material 402 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, spin on coating, including any combination of these, and others.

Figure 5:
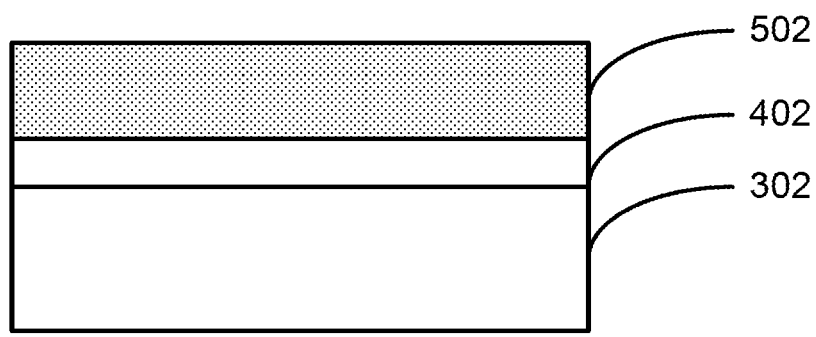

As shown in FIG. 5, the method includes forming a first electrode material 502 overlying first dielectric material 402. First electrode material 502 can be a suitable metal material including alloy materials, or a semiconductor material having a suitable conductivity characteristic. The metal material can be tungsten, aluminum, copper or silver, and others. These metal materials may be deposited using a physical vapor deposition process, chemical vapor deposition process, electroplating, or electroless deposition process, including any combinations of these, and others. The semiconductor material can be, for example, a suitably doped silicon material in certain embodiments. In certain embodiments, first electrode material 502 can include one or more adhesion material or diffusion material to prevent the metal material to contaminate portions of the device in certain embodiments. Diffusion barrier material or adhesion material may each include titanium, titanium nitride, tungsten nitride, tantalum nitride, and others. The semiconductor material can be a doped polysilicon material depending on the implementation.

Figure 6:
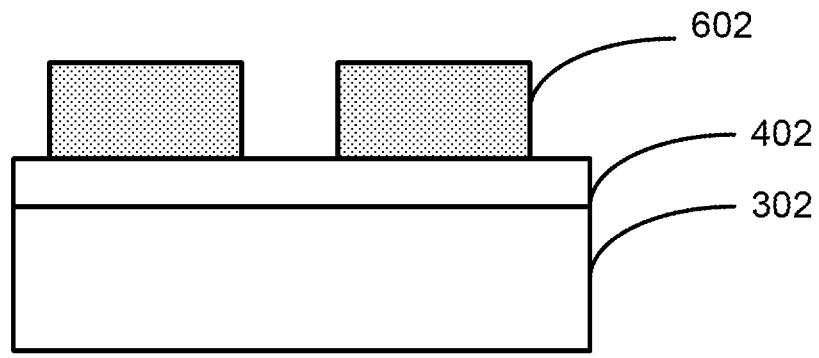

Referring to FIG. 6, the method subjects first electrode material 502 to a first pattern and etch process to form a plurality of first electrode structure(s) 602 overlying first dielectric material 402. For a crossbar configuration, first electrode structure 602 is spatially configured to extend in a first direction (e.g. in and out of the page).

Figure 7:
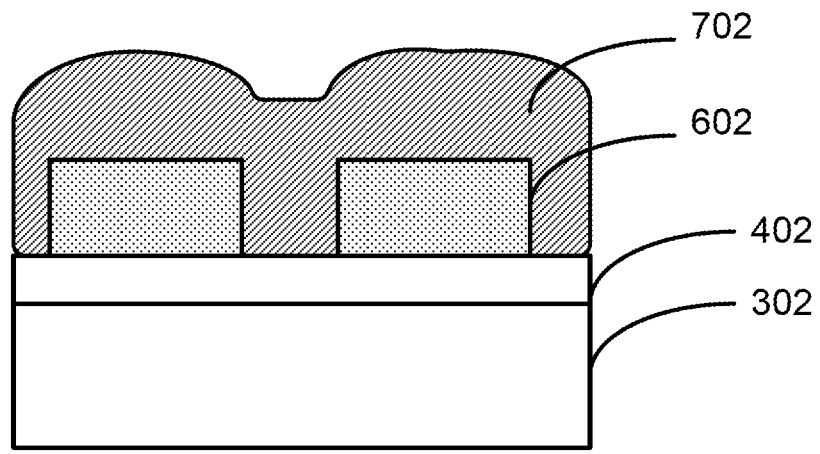

As shown in FIG. 7, a second dielectric material 702 is deposited overlying the plurality of first electrode structure 602 to isolate each of the plurality of first electrode structure 602. Second dielectric material 702 can include silicon oxide, silicon nitride, silicon oxynitride, a high K dielectric, a low K dielectric, or a dielectric stack having alternating layer of silicon oxide and silicon nitride (for example an ONO stack), including any combination of these, and others. Second dielectric material 702 can be deposited using techniques such as chemical vapor deposition, including low pressure chemical vapor deposition, plasma enhanced chemical vapor deposition, high density plasma chemical vapor deposition, atomic layer deposition (ALD), physical vapor deposition, spin on coating, including any combination of these, and others.

Figure 8:
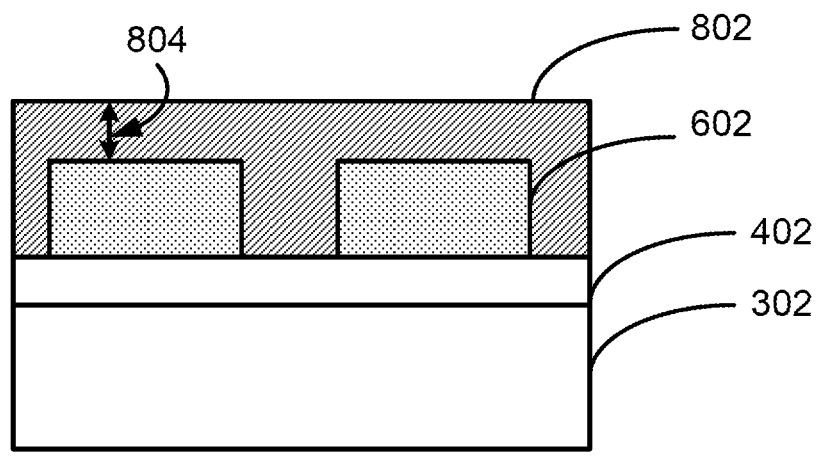

Referring to FIG. 8. Second dielectric material 702 is subjected to a planarizing process to form a substantially planarized surface region 802 and maintaining a thickness 804 of second dielectric material 702 overlying first electrode structure(s) 602. The planarizing process can be a chemical/mechanical process, an etch back process, a combination thereof, and others. Alternatively, the planarizing process can remove a portion of second dielectric material 702 to expose a surface region of first electrode structure 602 and a thickness 804 of second dielectric material can then be deposited overlying the exposed surface region of the first electrode structure 602.

Figure 9:
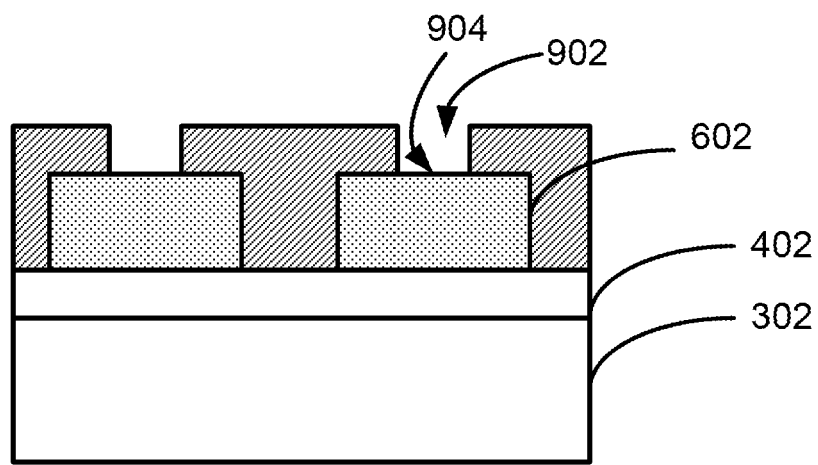

As shown in FIG. 9, in various embodiments, an opening structure 902 is formed in portions of the second dielectric material 702 to expose a surface region 904 of first electrode structure 602. First opening structure can be a trench structure configured substantially parallel to the first direction of the first electrode stricture(s) 602 in various embodiments. Opening structure 902 is characterized by an aspect ratio (ratio of height (up and down on the page) to width (left and right on the page).

Figure 10:
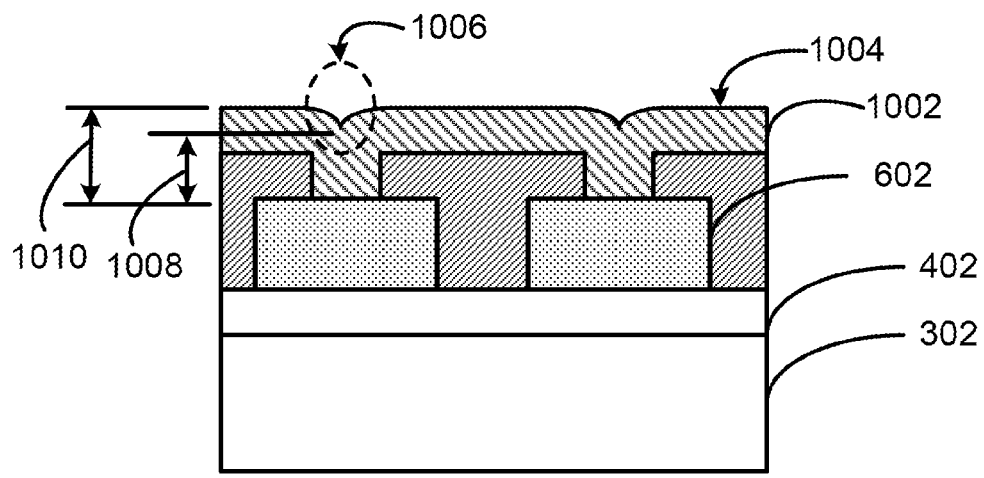

Referring to FIG. 10, the method includes forming a resistive switching material 1002 overlying the second dielectric material and to fill opening structure 902. Resistive switching material can be a non-conductive material characterized by an electric resistance depending on an electric field present in the resistive switching material. In various embodiments, the resistive switching material can be an amorphous silicon material having an intrinsic semiconductor characteristic or intrinsic amorphous silicon material. The intrinsic semiconductor characteristic is maintained by not intentionally doping the amorphous silicon material during deposition or after deposition.

The intrinsic amorphous silicon material 1002 may be deposited using a conformal deposition process to form a surface region 1004 having a planar region and an indent structure 1006. The conformal deposition can be a chemical vapor deposition process that provides a good step coverage for the resistive switching material. The indent structure is characterized by a width and a depth that can be determined by the deposition process parameters (for example, deposition rate, deposition temperature, and others) as well as the aspect ratio of the opening structure 902. As shown, indent structure 1006 has a tapered structure directed towards first electrode structure 602 and a thickness 1008 of resistive switching material 1002 is maintained between indent structure 1006 and first electrode structure 602. As can be seen in the figure, thickness 1008 is thinner than a thickness 1010 between the planar region of surface region 1004 and first electrode structure 602.

In various embodiments, because thickness 1008 is thinner than thickness 1010, when an electric field is applied across the resistive switching material 1002, a metallic filament, as described herein is preferentially formed within the region of indent structure 1006.

Figure 22:
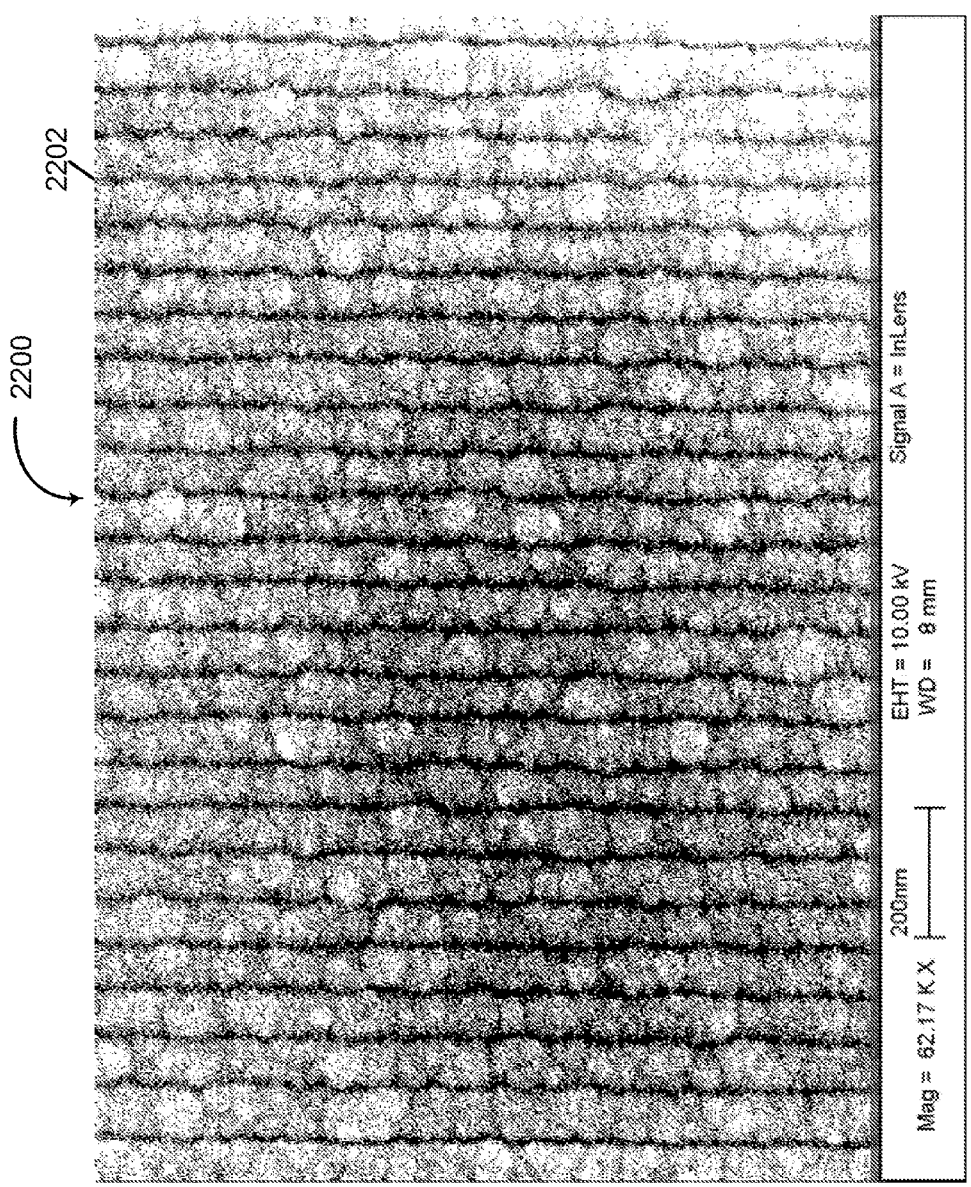
FIG. 22 is a scanning electron microscope image of an amorphous silicon material surface structure formed according to various embodiment of the present invention.

A scanning electron microscope image 2200 of an amorphous silicon material surface is illustrated in FIG. 22. The amorphous silicon material is formed by steps as illustrated in FIGS. 3-10. Dark regions as reference by numeral 2202 are the indent structures.

Figure 11:
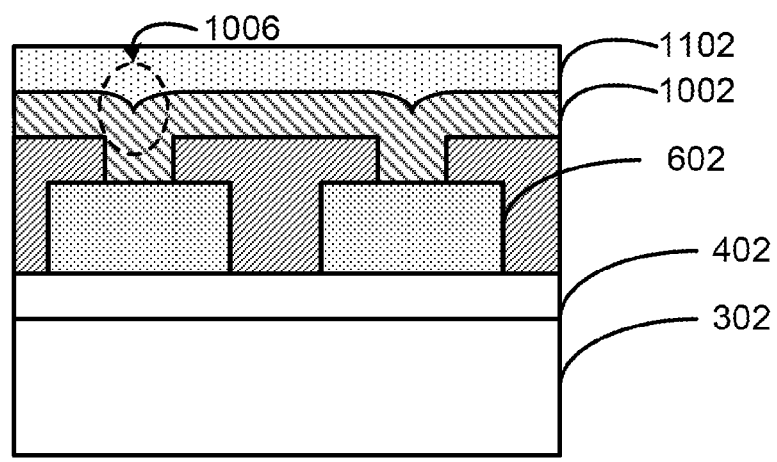
Figure 12:
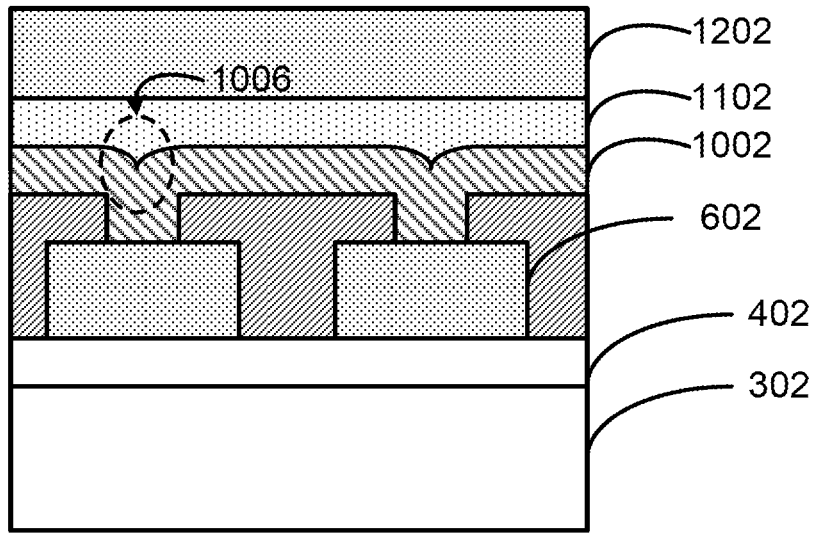
Figure 13:
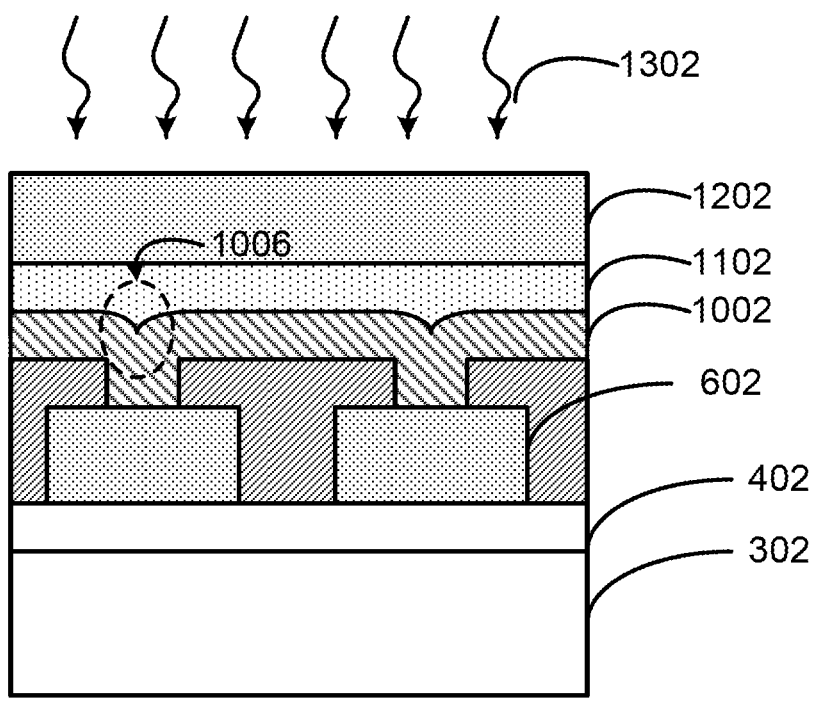

Referring to FIG. 11, the method includes forming a second electrode material 1102 overlying resistive switching material 1002 filling indent structure 1006, as shown. For amorphous silicon material as the resistive switching material, second electrode material 1102 may be silver, gold, palladium, platinum, copper, aluminum, nickel, zinc, and others. Second electrode material 1102 is selected to have a suitable diffusion characteristic in resistive switching material 1002 in a presence of an electric field. The electric field in a vicinity of the tapered structure 1006 is enhanced thus providing a path for a conductive filament to form in the resistive switching material 1002 upon application of the electric field. The conductive filament comprises a plurality of conductive particles derived from the second electrode material. The path can be a drift path or a diffusion path for the plurality of conductive particles upon application of the electric field. The electric field is enhanced, in the vicinity of the tapered region, threshold voltage required to form the conductive filament is reduced. Additionally, device dimension can be further scaled down as the conductive filament is defined.

In some embodiments, the silver material or the second electrode material 1102 is in direct contact with the amorphous silicon 1002 used as the resistive switching material in a specific embodiment. In other embodiments, a thin layer of material, e.g. oxide, nitride, is formed prior to the deposition of the silver material on top of the amorphous silicon used as the resistive switching material. This interposing thin layer of material may be naturally or specifically grown or formed. In some embodiments, one or more etch operations (e.g. HF etch, Argon etch) may help control the thickness of this layer. In some embodiments, the thickness of the material (e.g. oxide) prior to deposition of the silver material may range from about 20 angstroms to about 50 angstroms; in other embodiments, the thickness may range from about 30 angstroms to about 40 angstroms; or the like. In some embodiments, an additional layer of amorphous silicon may be disposed upon the top of the thin layer of (oxide, nitride, barrier) material, prior to deposition of the silver material. This additional layer of amorphous silicon (not intentionally doped) may be used to help bind the silver material to the thin layer of material (e.g. oxide, nitride, barrier). In some examples, the thickness may be on the order of 20-50 angstroms. In one example, the order of layers may be: undoped amorphous silicon used as the resistive switching material, a thin layer of material (e.g. oxide, nitride, barrier), a thin layer of amorphous silicon, and the silver material.

In various embodiments, the method includes forming a second wiring material 1202 overlying the second electrode material 1102. Second wiring material can be selected from a metal material such as aluminum, copper, and tungsten. Second wiring material may also be a doped semiconductor material (n+ doped or p+ doped) having a suitable conductivity depending on the implementation.

The method includes subjecting second wiring material 1202 to a third pattern and etch process 1302 to form a second wiring structure. The second wiring structure is spatially configured to extend in a second direction (e.g. left and right on the page) orthogonal to the first direction (e.g. in and out of the page) of first wiring structure 602 to form a crossbar structure for the resistive switching device. In other implementations, second wiring material may not be needed as second electrode material may provide for the second wiring material. Yet in another implementation, second wiring material 1202 and second electrode material 1102 may be concurrently subjected to the third pattern and etch process to form the second wiring structure. The second wiring structure and the first wiring structure provide connection to a respective transistor on the substrate for operations such as select, read, write, and erase for the resistive switching device.

As illustrated in FIGS. 14-21, an alternative method of forming a resistive switching device having a path for the formation of the conductive particles is provided. The path for the formation of the conductive particles is configured in a material region and configured as a preferred path for formation of a conductive filament structure to change the resistance of the resistive switching material in various embodiments.

Figure 14:
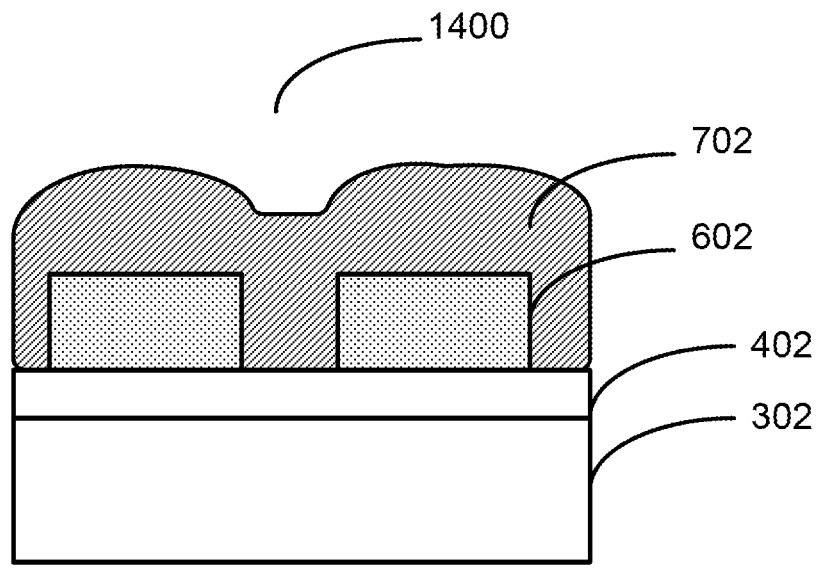
FIGS. 14-21 are simplified diagrams illustrating an alternative method of forming a resistive switching device for a non-volatile memory device according to various embodiments of the present invention.
Figure 15:
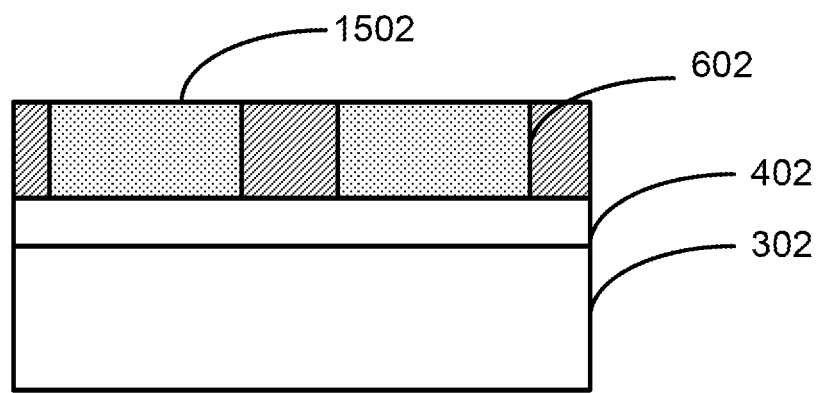
Figure 16:
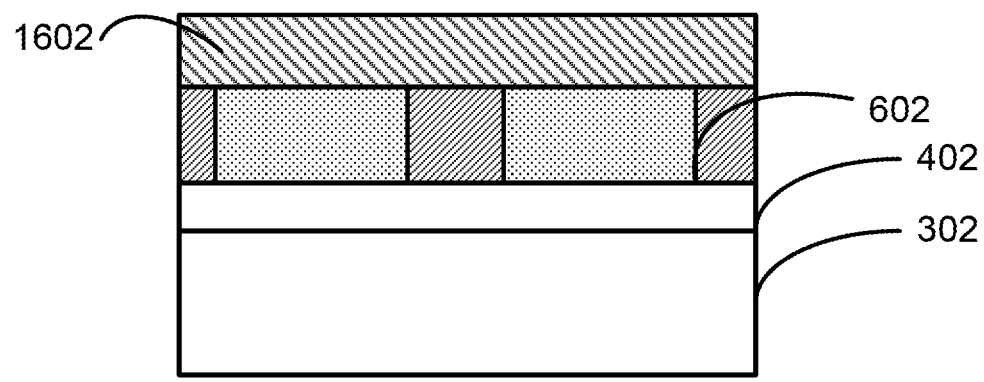

As shown in FIG. 14, a partially formed resistive switching device 1400 is illustrated. Partially formed resistive switching device 1400 can be fabricated according to steps in FIGS. 2-7. The method includes subjecting second dielectric material 702 to a planarization process to expose a surface region 1502 of first electrode 602. The planarization process can be a chemical mechanical polishing process or an etch back process, or a combination. In certain embodiments, the planarization process can use the first electrode material as an etch stop. In other embodiments, etch stop material can be implemented to maintain an integrity of first electrode surface 1502.

In various embodiments, the alternative method includes forming a resistive switching material 1602 overlying exposed surface region 1502 of first electrode structure 602 and second dielectric material 702, which has been planarized. Resistive switching material 1602 can be a non-conductive material characterized by an electric resistance depending on an electric field present in the resistive switching material. In various embodiments, resistive switching material 1602 can be an amorphous silicon material having an intrinsic semiconductor characteristic or intrinsic amorphous silicon material hereafter. The intrinsic semiconductor characteristic is maintained by not intentionally doped the amorphous silicon material during deposition or after deposition, as discussed in detail, above.

Figure 17:
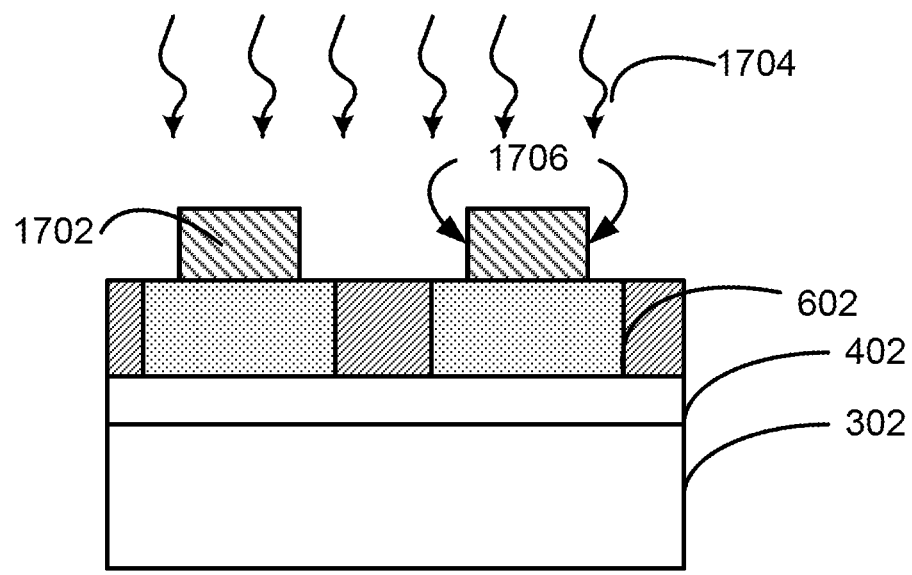
Figure 18:
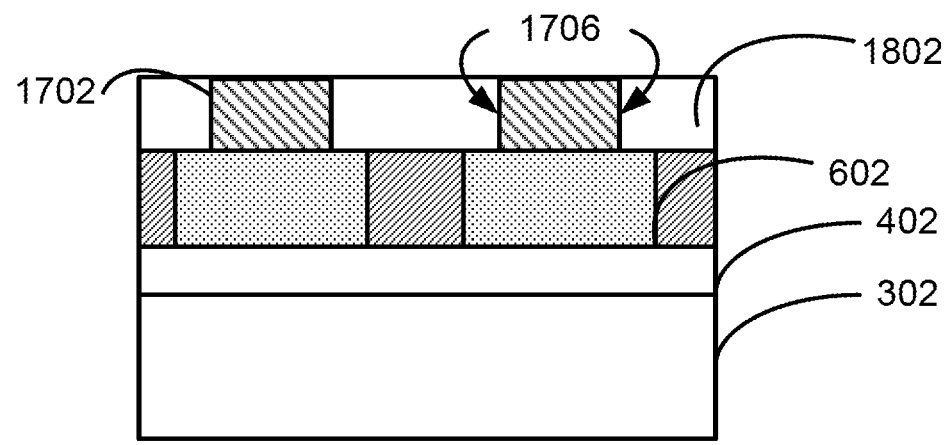

Referring to FIG. 17, the alternative method includes subjecting a resistive switching material to a pattern and etch process 1704 to form a resistive switching material structure 1702. Resistive switching material structure 1702 can be configured as a pillar stricture overlying the first electrode structure 602 and maintaining an electric and physical contact with first electrode structure 602 in various embodiments. Resistive switching material structure 1702 includes a vertical wall region 1706, as shown.

In various embodiments, the alternative method forms a third dielectric material 1802 overlying resistive switching material structure 1702 including vertical side wall region 1706. Third dielectric material can be a silicon oxide material deposited using a deposition process selected from a chemical vapor deposition process, a spin on glass (SOG), and a physical vapor deposition process including a combination thereof. Other suitable dielectric material may be used depending on the application.

Figure 19:
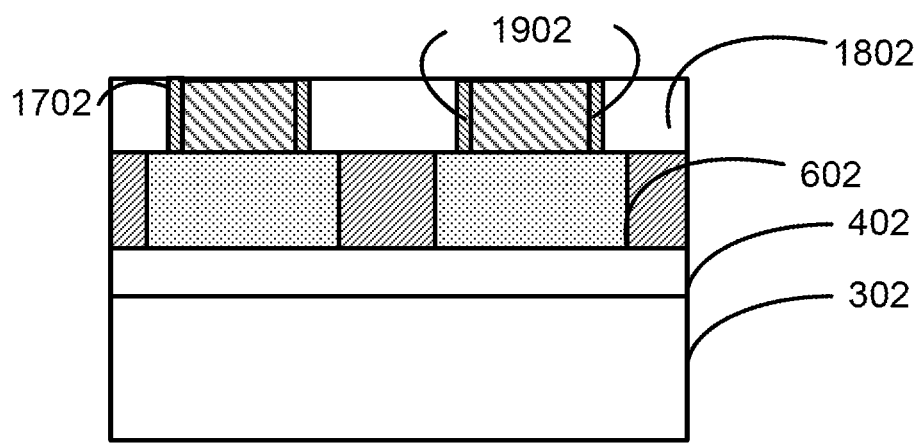

Referring to FIG. 19, the alternative method forms a first material 1902 in a first material region in a vicinity of the vertical side wall region as illustrated. First material 1902 is derived from an interaction of the resistive switching material (for example, the intrinsic amorphous silicon material) and the third dielectric material (for example, the silicon oxide material) in various embodiments.

Figure 20:
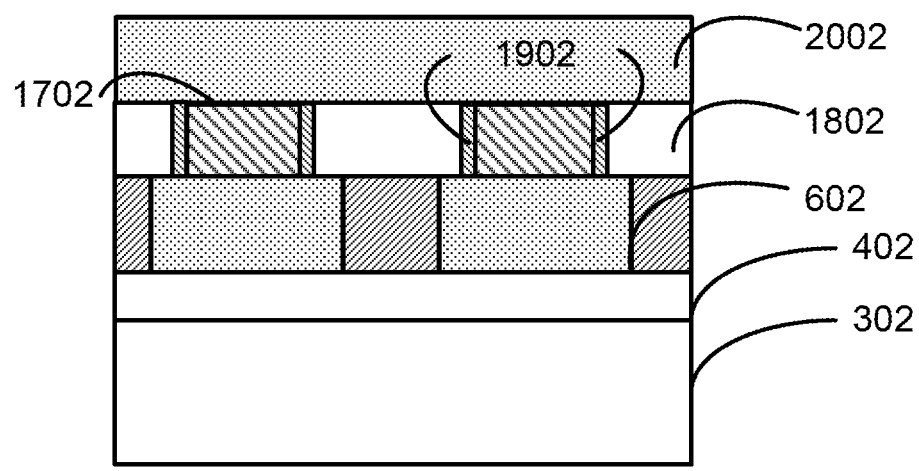

The alternative method forms a second electrode material 2002 overlying at least resistive switching material structure 1702 and first material region 1902 as shown in FIG. 20. For intrinsic silicon material as the resistance switching material, second electrode material 2002 can be an active metal material selected from silver, gold, palladium, platinum, copper, aluminum, nickel, zinc, and others. Second electrode material 2002 may be deposited using techniques such as physical vapor deposition process, chemical vapor deposition process, electrochemical deposition (for example, electroplating, electroless plating, and others).

Figure 21:
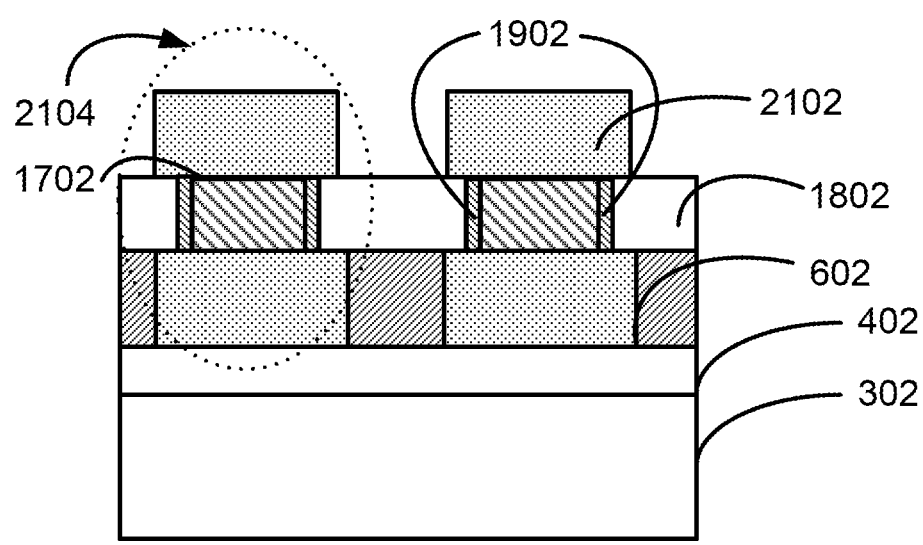

In various embodiments, second electrode material 2002 is subjected to a pattern and etch process to form a second electrode structure 2102, as shown in FIG. 21. Second electrode structure 2102 is configured to overlie resistive switching material structure 1702 as well as first material region 1902 in various embodiments.

In various embodiments, first material region 1902 is configured as a path for an active metal material region to form when an electric field is applied. The electric field may be a first voltage having a magnitude no less than a first threshold voltage applied to the second electrode. The first voltage is a positive voltage applied to the second electrode with respect to the first electrode in various embodiments. The active metal material 1702 region includes a filament structure comprising one or more active metal material particles. The filament structure is further characterized by a first distance between the one or more active material particles and a second distance between the filament structure and the first electrode.

As shown in FIG. 21, first electrode structure 602, resistive switching material structure 1702 including first material region 1902, and second electrode structure 2102 form a resistive switching device 2104 for a non-volatile memory device in various embodiments. In a programming operation (for example upon application of a positive voltage to second electrode 2102 with respect to first electrode 602), the filament structure extends towards the first electrode structure and cause the resistive switching device to change from a high resistance state (bit value "0") to a low resistance state (bit value 1). After programming, a negative voltage applied to second electrode 2102 in an erase operation would cause the filament structure to retract and cause the resistive switching device to be in the high resistance state. The erase voltage can have substantially a same amplitude as the programming voltage or can also be different depending on the implementation. Again, for intrinsic amorphous silicon material as the resistive switching material and silver as the active metal material, the programming voltage is typically no greater than 8 volts and can range from about 2 volts to 6 volts depending on the device dimension, and others. Resistive switching device 2104 is characterized by a good data retention (maintaining respective resistance states after removal of programming or erase voltage) and high endurance (ability to cycle).

The present application has been described using intrinsic amorphous silicon material as the resistive switching material, embodiments according to the present invention can be applied to other resistive switching devices where the switching mechanism is base on a conductive filament formed in a resistive switching material as would be obvious to one skilled in the art.

Some representative claims are as follows:

26. A method of forming a resistive switching device for a non-volatile memory device, comprising:
providing a substrate having a surface region;
forming a first dielectric material overlying the surface region of the substrate;
forming a first electrode structure overlying the first dielectric material;
forming s resistive switching material structure overlying the first electrode, the resistive switching material comprising a vertical side wall region;
forming a second dielectric material overlying the resistive switching material structure including the vertical side wall region;
forming a first material derived from the resistive switching material and the second dielectric material in a first material region in a vicinity of the vertical side wall region; and
forming a second electrode structure overlying the resistive switching material structure including the first material region.

27. The method of claim 26 wherein the substrate comprises a semiconductor material selected from monocrystalline silicon, silicon on insulator (SOI), silicon germanium, and polycrystalline silicon.

28. The method of claim 26 wherein the first dielectric material is selected from: silicon oxide, silicon nitride, a dielectric stack of alternating layers of silicon oxide and silicon nitride (ONO), a high K dielectric material, a low K dielectric material, and a spin on glass material.

29. The method of claim 26 wherein the resistive switching material structure comprises an amorphous silicon material having an intrinsic semiconductor characteristic.

30. The method of claim 26 wherein the second dielectric material comprises a silicon oxide material deposited using a deposition process selected from a chemical vapor deposition process, a spin on glass (SOG), and a physical vapor deposition process and a combination thereof.

31. The method of claim 26 wherein the second electrode structure comprises an active metal material selected from silver, gold, palladium, platinum, copper, aluminum, nickel, and zinc.

32. The method of claim 26 wherein the active metal material forms an active metal material region in a portion of the first material region upon application of a first voltage having an magnitude no less than a first threshold voltage to the second electrode.

33. The method of claim 32 wherein the active metal material region comprises a filament structure, the filament structure comprising one or more active metal material particles.

34. The method of claim 32 wherein the first voltage is a positive voltage applied to the second electrode with respect to the first electrode.

35. The method of claim 26 wherein the first material region provides a path for forming the active metal material region.

36. A resistive switching device for a non-volatile memory device, comprising:
a first electrode structure;
a resistive switching material structure comprising a resistive switching material having a vertical side wall region overlying the first electrode;
a dielectric material overlying the resistive switching material structure including the vertical side wall region;
a first material region comprising a first material configured in a vicinity of the vertical side wall region, the first material being formed from the dielectric material and the resistive switching material; and
a second electrode structure overlying the resistive switching material structure and overlying the first material region.

37. The device of claim 36 wherein the first electrode structure comprises a semiconductor material.

38. The device of claim 36 wherein the resistive switching material comprises an amorphous silicon material having an intrinsic semiconductor characteristic.

39. The device of claim 36 wherein the dielectric material comprises a silicon oxide material.

40. The device of claim 36 wherein the second electrode structure comprises an active metal material selected from silver, gold, palladium, platinum, copper, aluminum, nickel, and zinc.

41. The device of claim 36 wherein the active metal material forms an active material region derived from the second electrode structure at least in the first material region upon application of a first positive voltage to the second electrode structure.

42. The device of claim 36 wherein the first material region provides a path for the active metal material upon application of the first voltage to cause the resistive switching device to change from a high resistance state to a low resistance state.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A method of forming a resistive switching device for a non-volatile memory device, comprising:

providing a substrate having a surface region;
forming a first dielectric material overlying the surface region of the substrate;
forming a first electrode structure in a portion of the first dielectric material;
forming a second dielectric material overlying the first electrode;
forming an opening structure in a portion of the second dielectric material to expose a surface region of the first electrode structure, the opening structure being characterized by an aspect ratio, wherein the opening structure is associated with a first vertical surface and a second vertical surface;
forming a resistive switching material overlying the second dielectric material and filling at least a portion of the opening structure using a deposition process, the resistive switching material having a surface region characterized by a planar region and an indent structure, the indent structure overlying the first electrode structure, and wherein the indent structure is associated with a grain boundary between a first portion of the resistive switching material associated with the first vertical surface abutting a second portion of the resistive switching material associated with the second vertical surface, wherein the grain boundary provides a preferred path for a metallic filament;
maintaining a first thickness of resistive switching material between the planar region and the first electrode structure;
maintaining a second thickness of resistive switching material between the indent structure and the first electrode structure, wherein the first thickness is larger than the second thickness; and
forming a second electrode structure overlying the resistive switching material including the indent structure, comprising an active metal material filling in at least the indent structure and at least partially filling the opening structure, wherein the active metal material is adapted to form the metallic filament in the resistive switching material.

2. The method of claim 1 wherein the deposition process conformally forms the resistive switching material overlying the opening structure having the aspect ratio to cause the formation of the indent structure.

3. The method of claim 1 wherein the indent structure is characterized by a tapered structure, wherein the tapered region is directed towards the first electrode in the first opening structure and wherein the indent structure is characterized by a width within the range of about 2 nanometers to about 5 nanometers.

4. The method of claim 1 wherein the second electrode structure a portion being coupled to control circuits.

5. The method of claim 4 wherein the active metal material is selected from a group consisting of: silver, gold, palladium, platinum, copper, aluminum, nickel, and zinc.

6. The method of claim 1 wherein the resistive switching material comprises an amorphous silicon material having an intrinsic semiconductor characteristic not intentionally doped during deposition or after deposition.

7. The method of claim 1 wherein the active metal material forms an active metal region within at least a portion of the grain boundary of the resistive switching material upon application of a first electric field.

8. The method of claim 7 wherein the first electric field is enhanced in a vicinity of the indent structure to facilitate the formation of the active metal region within at least a portion of the grain boundary in the resistive switching material.

9. The method of claim 7 wherein the active metal region in the resistive switching material further comprises a filament structure extending towards the first electrode structure; and wherein the filament structure is characterized by a length and a distance between the filament structure and the first electrode.

10. The method of claim 1 wherein the resistive switching material is characterized by a variable resistance depending on a polarity and magnitude of the electric field applied.

11. The method of claim 1 wherein the first electrode structure comprises a p-type doped semiconductor material.

12. A resistive switching device formed according to a method comprising:

providing a substrate having a surface region;

forming a first dielectric material overlying the surface region of the substrate;

forming a first electrode in a portion of the first dielectric material;

forming a second dielectric material overlying the first electrode;

forming an opening structure in a portion of the second dielectric material to expose a surface region of the first electrode structure, the opening structure being characterized by an aspect ratio, a first sidewall, and a second sidewall;

forming a resistive switching material overlying the second dielectric material and filling at least a portion of the opening structure using a deposition process, the resistive switching material having a surface region characterized by a planar region and an indent structure, the indent structure overlying the first electrode structure, and wherein the indent structure is associated with a grain boundary between a first portion of the resistive switching material associated with the first sidewall abutting a second portion of the resistive switching material associated with the second sidewall, wherein the grain boundary provides a preferred path for a metallic filament;

maintaining a first thickness of resistive switching material between the planar region and the first electrode structure;

maintaining a second thickness of resistive switching material between the indent structure and the first electrode structure, wherein the first thickness is larger than the second thickness; and forming a second electrode structure overlying the resistive switching material including the indent structure, wherein the second electrode structure comprises a plurality of metal atoms are adapted to form the metallic filament in the grain boundary.

13. The resistive switching device of claim 12 wherein the indent structure is characterized by a tapered structure, wherein the tapered region is directed towards the first electrode in the first opening structure and wherein the indent structure is characterized by a width within the range of about 2 nanometers to about 5 nanometers.

14. The resistive switching device of claim 12 wherein the second electrode structure comprises an active metal material selected from a group consisting of: silver, gold, palladium, platinum, copper, aluminum, nickel, and zinc.

15. The resistive switching device of claim 14 wherein the resistive switching material comprises a plurality of defects; and wherein metal atoms from the active metal material are disposed in defects from the plurality of defects in the resistive switching material.

16. The resistive switching device of claim 14 wherein the metal atoms form a conductive filament within the resistive switching material.

17. The resistive switching device of claim 12 wherein the resistive switching material comprises an amorphous silicon material having an intrinsic semiconductor characteristic not intentionally doped during fabrication.

18. The resistive switching device of claim 12 wherein the first electrode comprises a p-type doped semiconductor material.

19. The resistive switching device of claim 12 further comprising:

forming a barrier layer in contact with and on top of the resistive switching material including the indent structure.

20. The resistive switching device of claim 19 wherein the barrier layer has a material thickness within a range of about 20 angstroms to about 50 angstroms; and wherein forming the second electrode structure comprises forming the second electrode structure in contact with and on top of the barrier layer.

* * * * *